United States Patent [19]

Wong et al.

[11] Patent Number: 5,596,512
[45] Date of Patent: Jan. 21, 1997

[54] METHOD OF DETERMINING THE CONDITION OF A BACK-UP BATTERY FOR A REAL TIME CLOCK

[75] Inventors: Albert C. K. Wong, Golden Valley; Romuald M. Jurewicz, St. Louis Park; Michael D. McCormack, Robbinsdale, all of Minn.

[73] Assignee: Thermo King Corporation, Minneapolis, Minn.

[21] Appl. No.: 633,328

[22] Filed: Apr. 17, 1996

Related U.S. Application Data

[63] Continuation of Ser. No. 290,165, Aug. 15, 1994, abandoned.

[51] Int. Cl.$^6$ ..................................................... G01R 31/00
[52] U.S. Cl. ............................ 364/550; 364/481; 307/66; 395/750
[58] Field of Search ........................... 364/481, 550, 364/550.01, 424.03, 424.04, 424.05, 569, 483, 273.4, 948.5; 324/427; 429/90; 307/64–66; 395/750; 368/203, 204

[56] References Cited

U.S. PATENT DOCUMENTS

| | | | |
|---|---|---|---|
| 4,231,026 | 10/1980 | Sullivan | 340/636 |
| 4,725,784 | 2/1988 | Peled et al. | 324/427 |
| 4,888,716 | 12/1989 | Ueno | 364/550 |
| 4,914,393 | 4/1990 | Yoshido | 324/427 |
| 4,958,127 | 9/1990 | Williams et al. | 324/426 |
| 5,032,825 | 7/1991 | Kuznicki | 340/636 |
| 5,047,961 | 9/1991 | Simonsen | 364/550 |
| 5,115,182 | 5/1992 | Ehmke et al. | 320/14 |
| 5,162,741 | 11/1992 | Bates | 324/431 |
| 5,216,357 | 6/1993 | Coppola et al. | 364/483 X |
| 5,267,222 | 11/1993 | Williams et al. | 364/569 X |
| 5,281,955 | 1/1994 | Reich et al. | 364/551.01 X |
| 5,302,858 | 4/1994 | Folts | 307/66 |
| 5,321,626 | 6/1994 | Palladino | 364/483 |
| 5,345,392 | 9/1994 | Mito et al. | 364/483 |
| 5,390,130 | 2/1995 | Watanabe et al. | 364/483 |
| 5,408,421 | 4/1995 | Prest et al. | 364/569 |

*Primary Examiner*—James P. Trammell
*Assistant Examiner*—Edward J. Pipala
*Attorney, Agent, or Firm*—M. G. Panian

[57] ABSTRACT

A method of determining the condition of a battery which backs up a real-time clock (RTC) when a main power supply fails or is disconnected, in a system which includes a controller having a volatile random access memory (VRAM) and a non-volatile random access memory (NVRAM). The method includes the steps of periodically storing the time value of the RTC in NVRAM, and periodically writing a predetermined data pattern in VRAM, while the main power supply adequately powers the real time clock. The method then includes the steps of detecting a power-down condition of the main power supply, and terminating the recording and writing steps when the detecting step detects power-down. Return of main power, or power-up, is then detected, with the data pattern stored in VRAM then being compared with the predetermined data pattern. When the patterns are not the same, indicating more than a transitory loss of main power, the difference between the time value indicated by the RTC upon power-up and the last time value of the RTC stored in NVRAM before power down is compared with a predetermined constant time value. When the RTC has not incremented by at least the predetermined constant time value the method includes the step of indicating that the back-up battery is bad.

14 Claims, 3 Drawing Sheets

METHOD OF DETERMINING THE CONDITION OF A BACK-UP BATTERY FOR A REAL TIME CLOCK

This application is a continuation of application Ser. No. 08/290,165 filed Aug. 15, 1994, now abandoned.

TECHNICAL FIELD

The invention relates in general to determining the condition of a battery, and more specifically to a method of determining the condition of a battery used to back-up a real time clock (RTC) when a main power supply for the RTC has failed or has been disconnected.

BACKGROUND ART

It is common to back up a real-time clock (RTC) with a battery, such as a long-life lithium battery, so that when a main power supply for the RTC fails, or has been disconnected, the RTC will continue to indicate the correct time and provide correct time intervals, such as for periodically recording data. It is also known to provide voltage sensing battery degradation or failure arrangements, to indicate when a battery should be replaced.

In many systems which use a RTC, an analog input may not be available for monitoring the voltage of a back-up battery, or it may not be desirable to dedicate an analog input to such a purpose. It is thus desirable, and it is an object of the invention, to determine when a back-up battery for a RTC should be replaced, without directly monitoring the output voltage of the back-up battery.

SUMMARY OF THE INVENTION

Briefly, the invention is a method of determining the condition of a battery which backs up a real-time clock (RTC) when a main power supply for the RTC fails or is disconnected. The method includes the steps of storing a time value of the RTC in non-volatile memory means while powered by the main power supply, just prior to the loss of the main power supply, detecting return of the main power supply, comparing the time value of the RTC upon return of the main power supply with the stored time value of the RTC, and indicating that the back-up battery is bad when the comparison step finds a predetermined relationship between the compared time values.

In a preferred embodiment of the invention, the system includes a controller having volatile random access memory means (VRAM) and non-volatile random access memory means (NVRAM), and the method comprises the steps of periodically storing the time of the RTC in NVRAM, and periodically writing a predetermined data pattern in VRAM, while the main power supply powers the RTC. The method then includes the step of detecting an interruption of the main power supply, and the step of terminating the recording and writing steps when the detecting step detects an interruption of the main power supply. Return of the main power supply is then detected, followed by the step of comparing the data pattern stored in VRAM with the predetermined data pattern. When the comparison step finds that the stored data pattern does not match the predetermined data pattern, a difference time value is provided in response to the difference between the time value indicated by the RTC after return of an adequate main power supply and the last time value of the RTC stored in NVRAM just before detection of an interruption of the main power supply. The difference time value is then compared with a predetermined constant time value. When the comparison of time values by the comparison step finds that the real time clock has not incremented by at least the predetermined constant time value, the method indicates that the back-up battery is bad.

When it is found that the stored data pattern lost its integrity, it indicates that the interruption of the main power supply was long enough for data stored in the VRAM to be unreliable, e.g., longer than 2 to 3 seconds. The predetermined constant time value may then be 2 seconds, for example. If the RTC has not incremented by at least 2 seconds, it is known that the back-up battery is bad.

When the comparison step finds that the stored data pattern value matches the predetermined data pattern, it is then known that the interruption of the main power supply was momentary or transitory, as the main power supply returned before the integrity of the data pattern stored in VRAM was lost. In this event, the main power interruption is ignored.

BRIEF DESCRIPTION OF THE DRAWINGS

The invention will become more apparent by reading the following detailed description in conjunction with the drawings, which are shown by way of example only, wherein.

DESCRIPTION OF PREFERRED EMBODIMENTS

Figure 1:
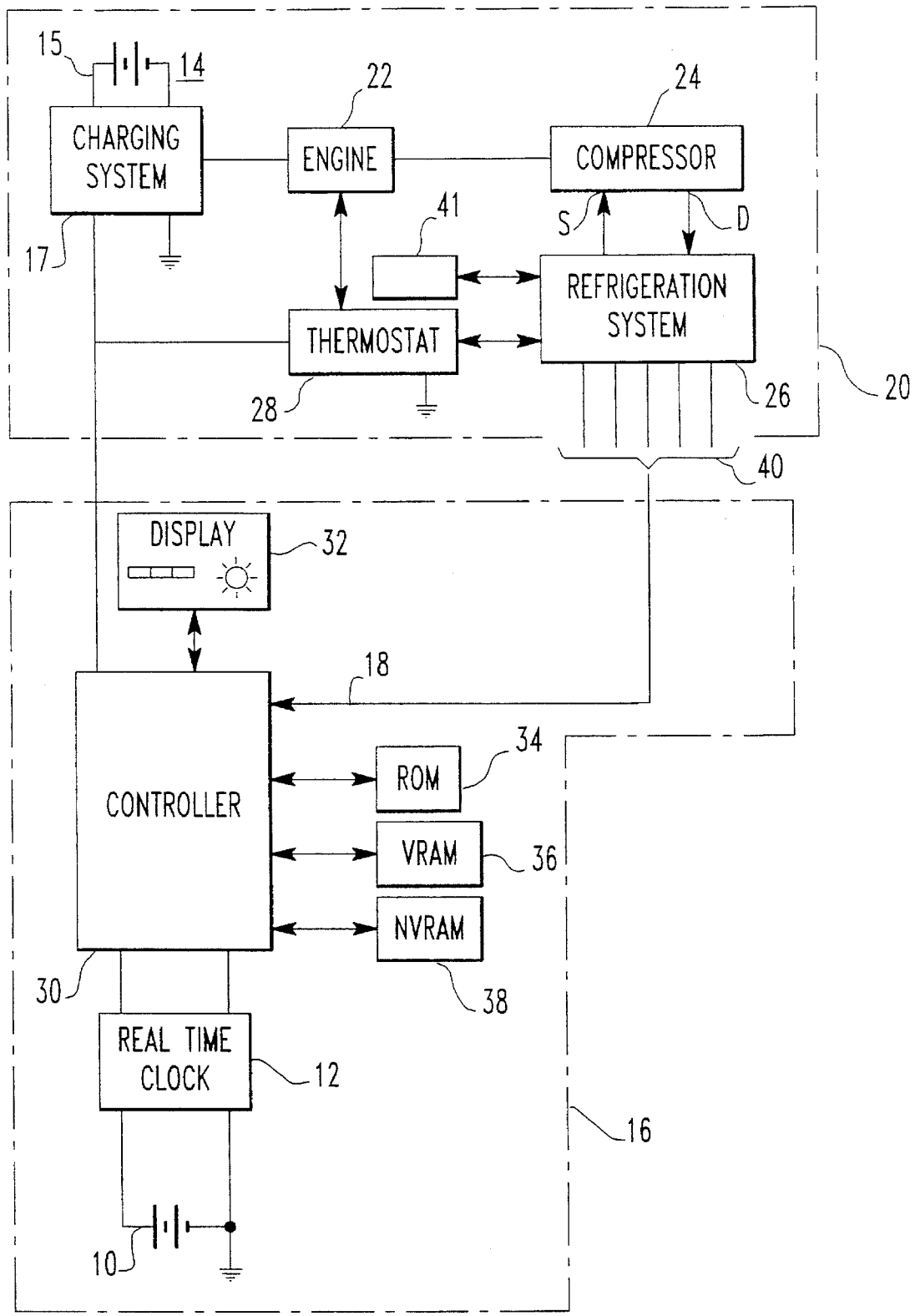
FIG. 1 is a partially block and partially schematic diagram of data recorder for periodically recording data from a refrigeration system, with the data recorder having a real time clock which is normally powered by a power supply associated with the refrigeration system, and which is backed up with a battery which may be monitored by the methods of the invention.

Referring now to the drawings, and to FIG. 1 in particular, there is shown an example of the use of a back-up battery 10 for providing power for a real time clock (RTC) 12 when a main power supply 14 is disconnected or has failed. In this example, the RTC 12 is part of a data logger 16 which periodically records data 18 responsive to the operation of a refrigeration unit 20, with the recording intervals being controlled by RTC 12, such as every two minutes, for example.

Refrigeration unit 20 may be a transport refrigeration unit, for example, such as the transport refrigeration units associated with straight trucks, tractor-trailer units, and containers. Such transport refrigeration units have a power supply 14 which, in addition to providing power for the operation of refrigeration unit 20, functions as the main power supply for the data logger 16. FIG. 1 illustrates a power supply 14 for a truck or trailer type of transport refrigeration unit 20, with power supply 14 including a battery 15 and associated charging system 17. The battery 15 starts an internal combustion engine 22 connected to drive a refrigerant compressor 24. Refrigerant in the form of hot vapor is discharged from a discharge port D of compressor 24 and directed to an associated refrigeration system 26 which is controlled by a thermostat 28. Refrigerant vapor is returned to a suction port S of compressor 24.

Data logger 16, for example, may be a data management system DMS-IID which is commercially available from the assignee of the present patent application. This data management system includes a microprocessor based controller 30 which, in addition to the RTC 12 and back-up battery 10, includes a display 32, a read-only memory (ROM) 34, a volatile random-access memory (VRAM) 36, and a non-volatile random access memory (NVRAM) 38. Data 18 concerning the operation of refrigeration unit 20 is provided by one or more user selected analog sensors and optional digital inputs, indicated generally at 40, such as a return air temperature sensor which indicates the temperature of air returning to refrigeration unit 20 from a space 41 conditioned by refrigeration unit 20, a discharge air temperature sensor which indicates the temperature of air discharged by refrigeration unit 20 into conditioned space 41, a humidity sensor which indicates the humidity of the air in conditioned space 41, and digital inputs which indicate when refrigeration unit 20 is operating in cooling, heating and defrost cycles, as well as whether engine 22 is running at predetermined low or at high speeds.

Figure 2:
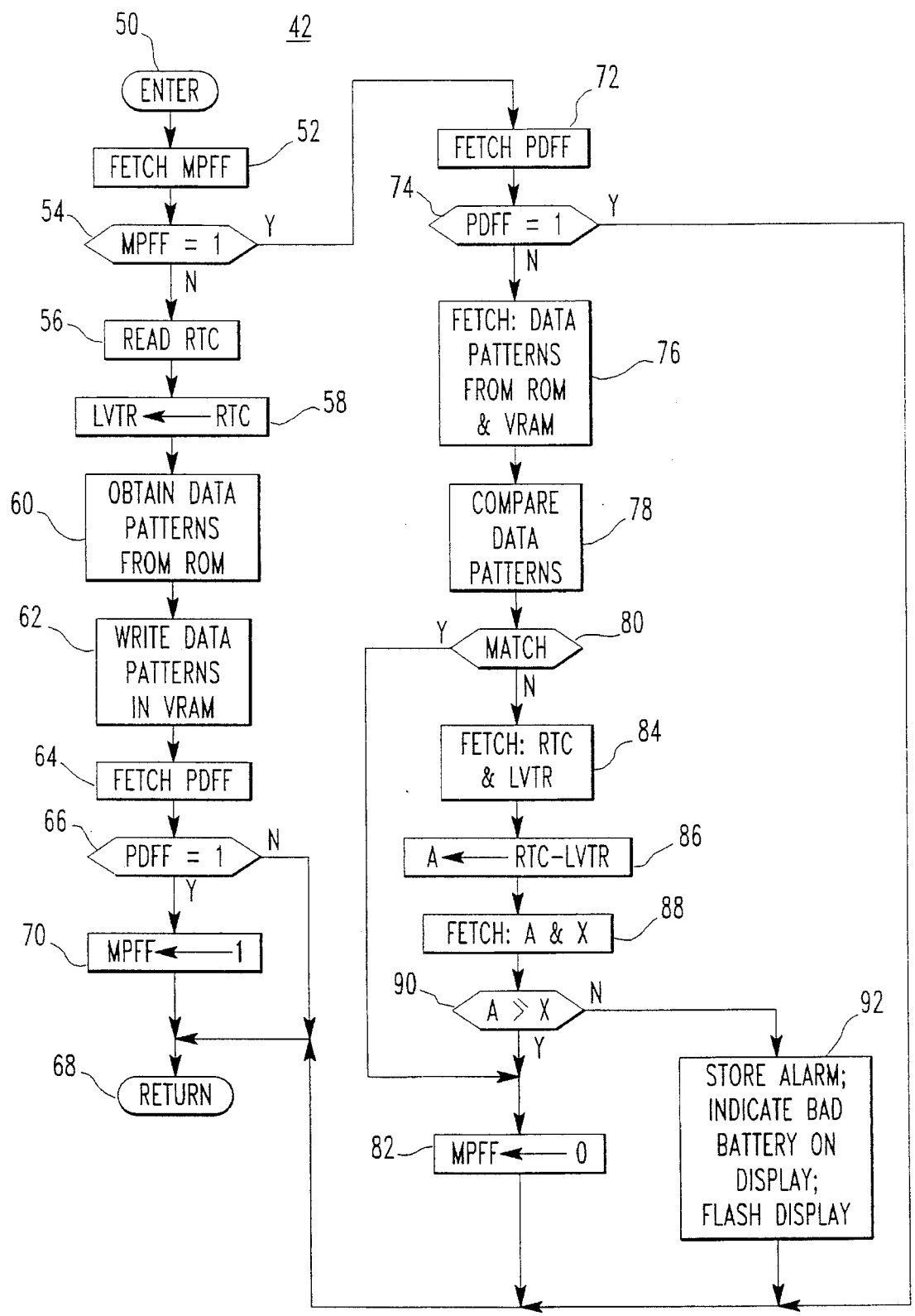
FIG. 2 is a flow diagram of a program which implements the battery monitoring methods of the invention.
Figure 3:
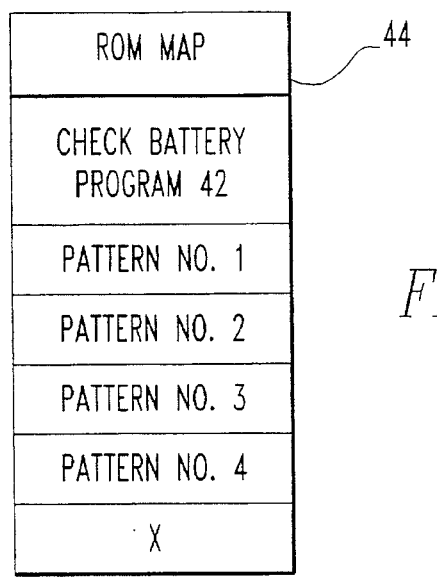
FIG. 3 is a ROM map which indicates predetermined data patterns and a predetermined constant which is stored in a read-only memory (ROM) of the data recorder shown in FIG. 1.
Figure 4:
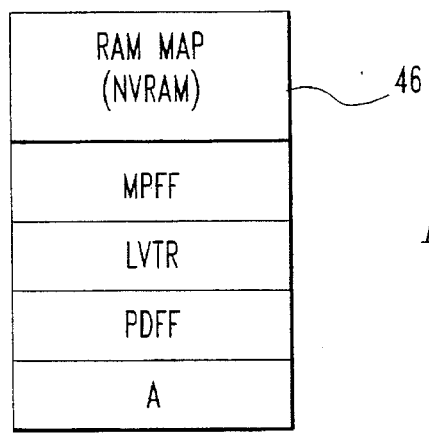
FIG. 4 is a RAM map of a non-volatile random-access memory (NVRAM) listing program variables stored in NVRAM during the running of the program shown in FIG. 2.
Figure 5:
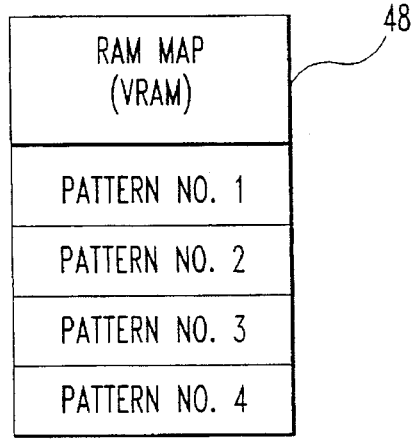
FIG. 5 is a RAM map of a volatile random-access memory (VRAM) listing program variables stored in VRAM during the running of the program shown in FIG. 2.

FIG. 2 is a flow chart of a program 42 stored in ROM 34 which implements the methods of the invention. FIG. 3 is a ROM map 44 which lists certain items stored in ROM 34 used by program 42; FIG. 4 is a RAM map 46 which lists certain program variables developed by program 42 which are stored in NVRAM 38; and FIG. 5 is a RAM map 48 which lists certain program variables developed by program 42 which are stored in VRAM 36.

Program 42 is entered at 50 and step 52 fetches a main power failure flag MPFF from NVRAM 38. Step 54 determines if flag MPFF is set, i.e., a logic one. At this point of the description, flag MPFF will not be set, indicating that the main power supply 14 has not been interrupted, and step 54 goes to step 56 which reads the present time value output by RTC 12. Step 58 stores the present time value of RTC 12 at address LVTR of NVRAM 38, and this stored time value will be referred to as time value LVTR.

Step 60 obtains one or more predetermined data patterns stored in ROM 34. For purpose of example, four data patterns, referred to as Pattern Nos. 1, 2, 3 and 4, are stored in ROM 34, and step 62 writes these four data patterns at four predetermined address locations in VRAM 36. Any number of data patterns may be used, with the data patterns being used to determine when the main power supply 14 has been interrupted for a significant length of time, i.e., time for data stored in VRAM 36, which is powered by the main power supply 14, to start to lose its integrity when the main power supply 14 is disconnected or becomes inadequate for some reason. VRAM's, start to lose data integrity 2 or 3 seconds after loss of electrical power.

When controller 30 senses that the main power supply is being lost, it runs a conventional power-down program which includes setting a power failure flag PDFF in NVRAM 38. Step 64 fetches flag PDFF and step 66 checks to see if it has been set. When flag PDFF is found to be a logic zero, indicating that no power-down condition has been detected, step 66 exits program 42 at 68. Program 42 then cycles through steps 50 through 68, each time writing the latest time value of RTC 12 at location LVTR of NVRAM 38, and each time writing the predetermined data patterns in VRAM 36. This periodic cycling through program 42 continues until step 66 finds flag PDFF has been set to a logic one, indicating that the main power 14 is in the process of being interrupted, such as by being disconnected, or due to some failure in the battery and charging system 14. Upon step 66 finding flag PDFF has been set, step 66 proceeds to step 70 which sets main power failure flag MPFF in NVRAM 38.

Upon the next running of program 42, step 54 will find that main power failure flag MPFF has been set to a logic one, and program 42 branches to a portion of program 42 which will check the condition of back-up battery 10 when the main power 14 has been interrupted for a length of time which will enable an intelligent check of battery 10 to be made. Step 72 fetches flag PDFF from NVRAM 38, and step 74 checks the logic level of flag PDFF. When flag PDFF is a logic one, indicating that the main power has not returned, step 74 exits program 42 at 68.

When the main power supply 14 returns, controller 30 will run a conventional power-up routine, which resets power failure flag PDFF. Step 74 of program 42 will then find flag PDFF has been reset to a logic zero, and step 76 fetches the data patterns stored in VRAM 36, as well as the predetermined data patterns stored in ROM 34. Step 78 compares the data patterns from VRAM 36 with the data patterns from ROM 34 and step 80 determines if the comparison found that the patterns matched. If the data patterns stored in VRAM 36 match the predetermined data patterns stored in ROM 34, then the interruption in the main power supply 14 was not long enough for the data in VRAM 36 to lose its integrity, indicating that the power interruption was less than about 2 to 3 seconds. In this event, the condition of back-up battery 10 is not checked, and step 80 proceeds to step 82, which resets main power failure flag MPFF, and step 82 proceeds to program exit 68.

When step 80 finds that the data patterns stored in VRAM 36 do not match those stored in ROM 34, it indicates that the power interruption exceeded the data retention time of VRAM 36, and program 42 proceeds to a portion thereof which checks the condition of back-up battery 10. Step 84 fetches the present time value, called RTC, output by RTC 12. RTC 12 should have been powered by back-up battery 12 during the interruption of the main power supply 14, and should have accurately advanced in time. Step 84 also fetches the last time value of RTC 12 stored at location LVTR of NVRAM 38, called time value LVTR, which is the last time value output by real time clock 12 while powered by the main power supply 14, before interruption of the main power supply 14.

Step 86 provides a difference time value "A" which is responsive to the difference between the time value RTC presently indicated by RTC 12 and the time value LVTR of RTC 12 stored at location LVTR of NVRAM 38 just prior to interruption of power supply 14. As hereinbefore stated, if back-up battery 10 is functional the difference time value "A" should be greater than the data retention time of VRAM when deprived of electrical power, e.g., at least about 2 to 3 seconds. Step 88 fetches a constant time value "X" stored in ROM 34, as well as the difference time value "A". Step 90 compares time value "A" with time value "X". Value "X" may be 2 (seconds), for example. If time value "A" is equal to, or greater than the constant time value "X", it indicates that back-up battery 12 has advanced RTC 12, and that the back-up battery 12 is good. Step 90 then goes to step 82, which resets flag MPFF, and step 82 proceeds to the program exit 68.

If step 90 finds that time value "A" does not equal or exceed time value "X", back-up battery 10 has not properly advanced RTC 12, and step 90 proceeds to step 92. Step 92 indicates that back-up battery 12 is bad, and should be replaced. Step 92 may do this in one or more ways, such as: (1) by storing an alarm code may be read out upon command by proper inputs via a keypad which may be part of data logger 16; (2) by displaying letters and/or numbers on LCD readout 94 on display 32 which indicate to an authorized user that the back-up battery 12 is bad; and/or (3) by flashing a visible indicator 96 on display 32.

In summary, instead of requiring an analog input from the back-up battery 10 which indicates the output voltage level of battery 10, the invention tests whether or not battery 10 is providing its intended function. The function of battery 10 is to keep real time clock 12 properly powered during an interruption of the main power supply 14. The invention determines when there has been a significant interruption of the main power supply 14, and after a significant interruption, the invention determines if the back-up battery 12 has sufficient voltage output to increment the real time clock 12. If real time clock 12 has not been incremented during a significant interruption of the main power supply 14, the invention then provides an indication that the back-up battery 12 is bad and should be replaced. An inadequate back-up battery 12 will almost always be indicated during a normal power-up sequence when an attendant is present, so that the back-up battery 12 may be immediately replaced.

We claim:

1. A method of determining the condition of a battery which backs up a real-time clock (RTC) when a main power supply for the RTC fails or is disconnected, comprising the steps of:

storing a time value of the RTC in non-volatile memory means while powered by the main power supply, just prior to a loss of the main power supply, detecting return of the main power supply, comparing the time value of the RTC upon return of the main power supply with said stored time value of the RTC, and indicating that the back-up battery is bad when the comparison step finds a predetermined relationship between the compared time values.

2. The method of claim 1 wherein the step of storing the time value of the RTC includes the step of periodically storing the value of the real time clock, detecting a power-down condition of the main power supply, and terminating the step of periodically storing the time value of the RTC upon detection of a power-down condition.

3. The method of claim 1 including the step of ignoring interruptions in the main power supply which persist for less than a predetermined period of time.

4. The method of claim 1 including the step of ignoring interruptions in the main power supply which persist for less than the memory retention time of a predetermined volatile memory means.

5. The method of claim 1 including the steps of:

writing a predetermined data pattern in volatile memory means while the volatile memory means is powered by the main power supply, just prior to the loss of the main power supply, providing a stored data pattern in a memory, detecting return of the main power supply, comparing said stored data pattern with the predetermined data pattern, and ignoring an interruption of the main power supply when the comparison step finds that the stored data pattern matches the predetermined data pattern.

6. The method of claim 5 wherein the step of writing a predetermined data pattern in volatile memory means includes the steps of periodically writing the predetermined data pattern in the volatile memory means, detecting an interruption of the main power supply, and terminating the writing step when the detecting step detects an interruption of the main power supply.

7. A method of determining the condition of a battery which backs up a real-time clock (RTC) when a main power supply fails or is disconnected, in a system which includes a controller having a read-only memory including a data pattern stored therein, a volatile random access memory (VRAM) and a non-volatile random access memory (NVRAM), comprising the steps of:

periodically storing the time of the RTC in NVRAM, while the main power supply powers the RTC, periodically writing a predetermined data pattern in VRAM, while the main power supply powers the RTC, detecting an interruption of the main power supply, terminating the recording and writing steps when the detecting step detects an interruption of the main power supply, detecting return of the main power supply, comparing the data pattern stored in VRAM with the predetermined data pattern, when the detecting step detects the return of the main power supply, providing a difference time value between the time value indicated by the RTC after return of the main power supply and the last time value of the RTC stored in NVRAM before detection of an interruption of the main power supply, when the comparison step finds that the stored data pattern does not match the predetermined data pattern, comparing the difference time value with a predetermined constant time value, and indicating that the back-up battery is bad when the comparison of time values by the comparison step finds that the RTC has not incremented by at least the predetermined constant time value.

8. The method of claim 7 including the step of ignoring the detection of an interruption of the main power supply when the data comparison step finds that the stored data pattern is the same as the predetermined data pattern.

9. The method of claim 7 including the step of selecting the predetermined constant time value such that the predetermined constant time value exceeds the time for data stored in the VRAM to lose its integrity after loss of the main power supply.

10. The method of claim 7 including the step of selecting the predetermined constant time value such that the predetermined constant time value is the minimum time by which the RTC should have incremented during a loss of the main power supply for a time sufficient to destroy the integrity of data in the VRAM.

11. The method of claim 7 wherein the step of writing a predetermined data pattern in VRAM includes the step of writing a plurality of predetermined data patterns in VRAM, each at a different memory address.

12. The method of claim 7 wherein the step of indicating the back-up battery is bad includes the step of storing an alarm code which identifies the back-up battery.

13. The method of claim 7 wherein the step of indicating the back-up battery is bad includes the step of flashing a visible indicator on and off.

14. The method of claim 7 wherein the step of indicating the back-up battery is bad includes the step of displaying predetermined indicia which identifies the back-up battery.

* * * * *